(12) United States Patent
Glazemakers

(10) Patent No.: US 10,089,009 B2
(45) Date of Patent: *Oct. 2, 2018

(54) METHOD FOR LAYERED STORAGE OF ENTERPRISE DATA

(71) Applicant: iNuron, Lochristi (BE)

(72) Inventor: Kurt Glazemakers, Grembergen (BE)

(73) Assignee: INURON, Lochristi (BE)

( * ) Notice: Subject to any disclaimer, the term of this patent is extended or adjusted under 35 U.S.C. 154(b) by 0 days.

This patent is subject to a terminal disclaimer.

(21) Appl. No.: 15/407,413

(22) Filed: Jan. 17, 2017

(65) Prior Publication Data

US 2017/0123675 A1 May 4, 2017

Related U.S. Application Data

(63) Continuation-in-part of application No. 14/247,362, filed on Apr. 8, 2014, now Pat. No. 9,547,453.

(30) Foreign Application Priority Data

Apr. 30, 2013 (EP) ..................................... 13166044

(51) Int. Cl.
*G06F 17/30* (2006.01)
*G06F 3/06* (2006.01)
(Continued)

(52) U.S. Cl.
CPC ............ *G06F 3/0607* (2013.01); *G06F 3/061* (2013.01); *G06F 3/0604* (2013.01); *G06F 3/064* (2013.01);
(Continued)

(58) Field of Classification Search
CPC .... G06F 3/0641; G06F 9/45558; G06F 3/064; G06F 3/067; G06F 3/0611; G06F 3/0604; G06F 3/0683; G06F 9/45533; G06F 11/1076; G06F 2212/222; G06F 12/0866; G06F 2009/45583; Y02B 60/1225; H04L 67/1097

See application file for complete search history.

(56) References Cited

U.S. PATENT DOCUMENTS

2007/0169059 A1 * 7/2007 Halambi ............... G06F 8/4452
717/160
2010/0228903 A1 9/2010 Chandrasekaran et al.
(Continued)

OTHER PUBLICATIONS

European Search Report from corresponding EP Application No. 13166044.1, dated Sep. 9, 2013.
(Continued)

*Primary Examiner* — Albert M Phillips, III
(74) *Attorney, Agent, or Firm* — Workman Nydegger

(57) ABSTRACT

A computer-implemented method for layered storage of enterprise data comprises receiving from one or more virtual machines data blocks; time-based grouping the data blocks into data containers; dividing each data container in X fixed length mega-blocks; for each data container applying erasure encoding to the X fixed length mega-blocks to thereby generate Y fixed length mega-blocks with redundant data, Y being larger than X; and distributed storing the Y fixed length mega-blocks across one or multiple backend storage systems.

8 Claims, 5 Drawing Sheets

(51) Int. Cl.
*G06F 11/10* (2006.01)
*H03M 13/15* (2006.01)
*G06F 9/455* (2018.01)
*H03M 13/00* (2006.01)
*H04L 29/08* (2006.01)
*G06F 12/0866* (2016.01)

(52) U.S. Cl.
CPC ............ *G06F 3/067* (2013.01); *G06F 3/0608* (2013.01); *G06F 3/0611* (2013.01); *G06F 3/0641* (2013.01); *G06F 3/0683* (2013.01); *G06F 9/45558* (2013.01); *G06F 11/1076* (2013.01); *H03M 13/154* (2013.01); *H03M 13/6569* (2013.01); *G06F 12/0866* (2013.01); *G06F 2009/45579* (2013.01); *G06F 2009/45591* (2013.01); *G06F 2212/222* (2013.01); *H04L 67/1097* (2013.01); *Y02B 60/1225* (2013.01); *Y02D 10/13* (2018.01)

(56) References Cited

U.S. PATENT DOCUMENTS

| | | |
|---|---|---|
| 2010/0287346 A1 | 11/2010 | Schreter |
| 2010/0332401 A1 | 12/2010 | Prahlad et al. |
| 2011/0265083 A1 | 10/2011 | Davis |
| 2011/0283071 A1 | 11/2011 | Yokoya et al. |
| 2011/0296440 A1 | 12/2011 | Laurich et al. |
| 2012/0047339 A1 | 2/2012 | Decasper et al. |
| 2012/0136841 A1 | 5/2012 | Ambat et al. |
| 2012/0179874 A1 | 7/2012 | Chang et al. |
| 2014/0181395 A1* | 6/2014 | Vincent ............... G06F 11/1456 711/111 |
| 2014/0281118 A1 | 9/2014 | Hepkin et al. |

OTHER PUBLICATIONS

Nam et al., "Reliability-Aware Deduplication Storage: Assuring Chunk Reliability and Chunk Loss Severity", 2011, 6 Pages.

* cited by examiner

METHOD FOR LAYERED STORAGE OF ENTERPRISE DATA

FIELD OF THE INVENTION

The present invention generally relates to layered storage of enterprise data, more precisely to a software-controlled method that implements a layered storage architecture enabling enterprises to store data in a virtual machine centric manner. The present invention in particular concerns storage of enterprise data in backend storage systems, like for instance remote cloud storage facilities, with reduced storage latency, reduced storage resource requirements and costs, and reduced dependency on specific storage hardware technology. The present invention aims at turning any existing backend storage capacity into high-speed storage for enterprises that require features like efficient and unlimited zero-copy snapshotting, thin cloning, thin provisioning, replicating, rollbacks, etc. of data at virtual machine level, as well as adequate protection against errors and recovery from outages of diverse storage hardware used in data centres or remote cloud storage facilities.

BACKGROUND OF THE INVENTION

Known methods for network-based storage of data are block based and they typically rely on a Storage Area Network or SAN, i.e. a dedicated network that provides access to storage devices such as disks, tapes, optical jukeboxes, etc., and enables block-level operations on the stored data. Alternatively, Network-Attached Storage or NAS may be deployed, to remotely store data using file-based protocols instead of block-based protocols. The data are usually stored in a Redundant Array of Independent Disks (RAID), i.e. multiple disk drives that form part of a single logical unit amongst which the data are distributed depending on the desired redundancy level. Such single logical unit has a logical unit number or LUN. In existing systems, the SAN/NAS system provides several LUNs to the hypervisor, i.e. a piece of software, firmware or hardware that serves, i.e. creates, runs, monitors and manages the different virtual machines on a host machine, i.e. a server or computer. A virtual machine or guest machine is a software implementation of a machine or computer, typically comprising a single operating system and application programs running on that operating system. Usually, plural virtual machines share the hardware resources of a single host machine. At present, physical servers or computers are easily supporting 10 or more virtual machines. Each computer or server is running a hypervisor to serve the virtual machines it is hosting. The computer-implemented method according to the present invention works in close cooperation with such hypervisor.

At present, redundant storage of large volumes in cloud storage systems, typically over the internet, is slow. As a consequence, storage of databases or other large volumes is still organized locally, i.e. close to the clients. On the one hand, the internet as medium to connect to remote storage systems is slow. On the other hand, known mechanisms that enable redundancy like erasure coding are object driven or file driven as a consequence of which they further slowdown remote storage when applied to block based storage.

The problem of internet latency for cloud storage has been addressed in several prior art documents.

United States Patent Application US 2012/0047339 entitled "Redundant Array of Independent Clouds" describes a mechanism for reliable block based storage in remote cloud storage facilities. US 2012/0047339 recognizes in paragraphs [0004]-[0006] the problem of slow network based storage via the internet and the need for redundancy. US 2012/0047339 consequently proposes to divide data in multiple blocks, and to store the data blocks with different cloud providers. The data can be reconstructed through use of a translation map. In order to be able to reconstruct erroneous blocks, a parity block may be generated from the N data blocks. The parity block is stored with yet another cloud provider.

Although US 2012/0047339 no longer relies on a single cloud storage provider, storage of data remains slow, i.e. limited by the internet speed. In addition, retrieval of data remains dependent on the slowest responding cloud storage provider since the data must be reproduced from data blocks retrieved from the different cloud storage providers. Only when one of the cloud storage providers is not responding at all, the parity block will be retrieved from a third cloud storage provider where it is stored.

United States Patent Application US 2011/0296440 entitled "Accelerator System for Use with Secure Data Storage" describes a system and method for accelerating the processing of and secure cloud storage of data. From paragraphs [003]-[0007] of US 2011/0296440, it is learned that the offloading certain processing from the motherboard, i.e. the secure parsing of data, in order to accelerate storage and processing of data is key to the system described in this patent application.

In addition to internet latency, it is recognized that computers or servers are at present easily hosting 10 or more virtual machines each of which generates its own input/output (I/O) patterns. These randomized I/O patterns further degrade storage efficiency. A straightforward solution consists in adding storage resources to the backend storage systems but this solution increases the cost for storage.

Another disadvantage of existing network based storage techniques that rely on SAN (block based) or NAS (file or object based) lies in the fact that they are LUN specific. A logical unit is a single storage volume that is identified and addressed through its LUN or Logical Unit Number. In a virtualized environment where multiple virtual disks are running on a single logical unit, features like roll back, snapshotting or replicating a single virtual machine are difficult to implement. The only way to roll back a virtual machine lies in retrieving an older snapshot of that virtual machine, mounting the file system and copying the requested virtual disks back to the primary storage logical unit. This is a complex and slow process.

Furthermore, existing network based storage techniques are tied to specific storage hardware. As a consequence, replication between different storage providers remains difficult. Gateways have been developed to be installed between the storage systems and hypervisors. These gateways however only solve a small part of the problem. They are difficult to manage, require the storage to reside near the hypervisor and remain expensive.

United States Patent Application US 2010/0332401 entitled "Performing Data Storage Operations with a Cloud Storage Environment, Including Automatically Selecting Among Multiple Cloud Storage Sites" for instance describes a method for data storage and migration in a cloud environment. In an attempt to tackle the problem of internet latency and packet loss, a cloud storage gateway introduces local caching and de-duplication. As part of a block based data migration process, data stored in cache (local, primary copies) are moved to cloud storage systems (secondary copies). As illustrated by FIG. 17 and described in paragraphs [0278]-[0286], containerized de-duplication is foreseen to avoid creating unnecessary additional instances of the data within secondary storage, i.e. within the cloud.

It is an objective of the present invention to provide a solution to the above identified problems inherent to existing SAN/NAS based network storage techniques. More particularly, it is an objective of the present invention to disclose a method for layered storage of enterprise data that reduces the effect of internet latency, reduces the dependency on particular storage hardware, reduces the storage resource requirements in general while enabling features like zero-copying, snapshotting, cloning, thin provisioning, replicating, rollbacks, etc. of data at virtual machine level.

SUMMARY OF THE INVENTION

According to the present invention, the above defined objectives are realized through a computer-implemented method for layered storage of enterprise data as defined by claim 1, the method comprising:
receiving from one or more virtual machines data blocks having a fixed length block size in the range from 4 kilobyte to 64 kilobyte;
time-based grouping the data blocks into data containers having a configurable maximum container size typically in the range from 1 megabyte to 256 megabyte;
dividing each data container in X fixed length mega-blocks, X being a first integer number;
for each data container applying erasure encoding to the X fixed length mega-blocks to thereby generate Y fixed length mega-blocks with redundant data, Y being a second integer number larger than X; and
distributed storing the Y fixed length mega-blocks over one or multiple backend storage systems.

Thus, the invention concerns a virtual machine centric layered storage method that combines efficient location based storage, i.e. local caching of data blocks, with redundant distributed time based back-end storage of data containers. The time based back-end storage with containerization enables enterprise features like zero copy snapshotting, cloning, replicating, rolling back, etc. at virtual machine level whereas the local caching turns any backend storage virtually into high-speed storage. Thanks to the containerization, the random I/O behavior of the virtual machines turns into sequential write operations. Thereafter, the containers are distributed in a redundant way across available backend storage using erasure encoding. The erasure coding enables to realize a configurable amount of redundancy such that a configurable amount of backend disks can get lost or remain non-responsive without loss of data and this without a need for RAID technology that suffers from lengthy rebuild times, i.e. days or even weeks. The method according to the present invention works with any type of existing backend storage solution, e.g. NAS, SAN, or JBOD (Just a Bunch Of Disks), and is consequently storage hardware independent. The backend storage can be a distributed local object store or it can be a remote object store in the cloud like for instance an Amazon S3 or Openstack Swift implemented object store. The backend store can be distributed over plural hardware units that reside in a single data center, plural hardware units that reside in one or more branch office, or plural hardware units that reside with different cloud storage providers accessible via a public wide area network (WAN) like the internet.

The caching of data containers or SCOs prior to distribution in the backend, is preferably implemented using fast memory like flash or SSD drives. The local caching accelerates the time to confirm a write operation to the hypervisor, and as such virtually accelerates the backend storage. The response time to a write request will improve when flash or SSD disks are used to implement the two-tier local caching in comparison to alternate storage devices.

Optionally, the data blocks may be de-duplicated per hypervisor serving one or more of the virtual machines and the de-duplicated data blocks may get stored in an additional local de-dup cache memory. For such de-duplicated data blocks stored locally in a de-dup cache, its address, a hash value, a container number and an offset number may be stored as metadata.

According to another optional aspect of the computer-implemented method for layered storage of enterprise data according to the current invention, the one or multiple backend storage systems are local or remote cloud storage systems operated by different cloud storage operators.

Indeed, in a preferred embodiment of the invention, the backend store consists of storage capacity that resides with different cloud storage providers. This way, retrieval of data shall no longer depend on the availability or responsiveness of a single cloud storage provider. In case of a read request, presence of the requested data in the local cache memory will be verified. In case the requested data are available in the cache, the local cache will serve the read request. In case the requested data are not available in the local cache, the data will have to be retrieved from the backend stores. In case the data are distributed over backend storage systems from different cloud storage providers, the redundancy introduced through erasure coding makes it possible to rely on the fastest responding cloud storage systems. As soon as X out of Y mega-blocks can be delivered by one or more fast responding cloud storage providers, the data container can be re-established and the read request can be served.

Further optionally, as defined by claim 3, the computer-implemented method for layered storage of enterprise data according to the present invention comprises: storing for each data block its address, a container number and an offset number as metadata.

Indeed, the local caching wherein data blocks are sequentially written in containers is preferably implemented as a transaction based cache. During each write operation in a container, the address of the data block, the number of the container wherein it is stored and the offset or pointer to the location in the container where it is stored, are logged as metadata. Once the transaction is logged, the write operation can be confirmed to the hypervisor. In case of a read request, the address will be used for look-up in the metadata. The read request will then be served from the local cache memory when the requested data are still available resulting in very fast read request handling. If not available in the local cache, the metadata will be used to retrieve the appropriate containers and requested data blocks from the backend storage system(s).

Still optionally, as defined by claim 4, the computer-implemented method for layered storage of enterprise data according to the present invention comprises: storing each data block that is not yet part of a data container that is remotely stored, in a distributed transaction log of another storage accelerator.

This mechanism will ensure that each data block of for instance 4 kbyte that is not yet part of a container that is stored in backend storage, is copied and synced onto fast memory, e.g. flash or SSD storage, of another storage accelerator. Storage in a distributed transaction log of another storage accelerator is done before a write request is confirmed to the requestor.

According to claim 5, the computer-implemented method for layered storage of enterprise data according to the present invention may be implemented with multiple backend storage systems comprising various types of backend storage systems.

Indeed, an advantage of the present invention is that it does not rely on particular backend storage technology, e.g. SAN NAS or JBOD. The backend storage system may be deployed locally or they may reside in one or more data centre, one or more branch office, in the public cloud, or a combination thereof.

Further optionally, as defined by claim 6, the computer-implemented method for layered storage of enterprise data according to the present invention may comprise:

scrubbing the mega-blocks distributed over multiple backend storage systems.

The second layer storage, i.e. the time based storage that forms part of the present invention, requires maintenance of older containers or snapshots stored in the backend storage system for performance reasons. Thereto, a scrubber that has access to the transaction logs can independently from the storage acceleration delete obsolete containers stored in the backend storage system and update the corresponding metadata and transaction logs. An advantageous aspect of the present invention is that the scrubbing does not impact the performance of read/write operations because most of these read/write operations will be handled by the local caching layer.

In addition to the computer-implemented method defined by claim 1, the present invention also concerns a corresponding data processing system as defined by claim 7 comprising means for carrying out the method.

The present invention further also relates to one or more non-transitory computer readable storage mediums as defined by claim 8, comprising having a computer program stored thereon for execution of the method according to the invention.

DETAILED DESCRIPTION OF EMBODIMENT(S)

Figure 1:
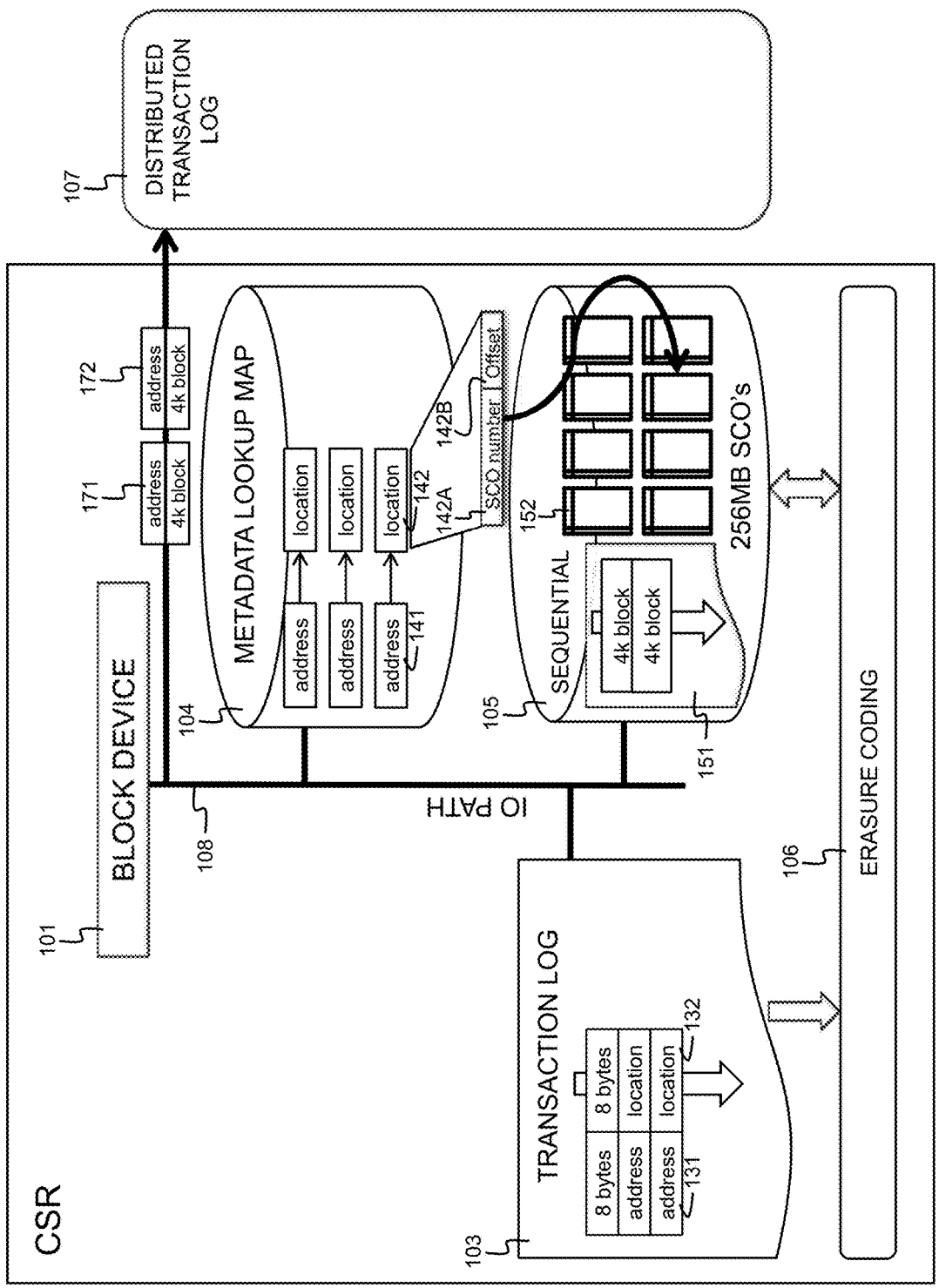
FIG. 1 is a functional block scheme illustrating an embodiment of the method for layered storage of enterprise data according to the present invention.

FIG. 1 shows the functional blocks or components of a cloud storage router or CSR which is an embodiment of the computer program according to the present invention that performs an embodiment of the method according to the present invention when executed by a processor. The cloud storage router illustrated by FIG. 1 is a virtual machine centric layered storage application that combines the function of a SAN, high speed SSD caching, backup and off-site replication, encryption and compression. The cloud storage router is a software implemented storage application that installs on any x86 hardware or can be used as a virtual storage appliance (VSA). The cloud storage router comprises a containerization function 105 that generates containers, the so called Storage Container Objects or SCO's 151 and 152, from a configurable collection of 4 kbyte data blocks. The SCO's have a configurable maximum length that is supposed to be set to 256 Mbyte in FIG. 1. The generated SCO's can be stored in backend storage systems, e.g. a distributed local object store running within the same VSA or remote object storage like for instance an Amazon S3 or an Openstack Swift implemented storage. This second storage layer wherein the 4 kbyte long data blocks are containerized in SCO's is a time-based storage implementation because the 4 kbyte long data blocks are sequentially stored in the SCO's. The second, time-based storage layer enables features like unlimited zero-copy snapshotting, cloning, and easy replication. The second layer makes the storage independent of the location. The object can be stored distributed over different x86 hardware units that reside within one or more data centers, within one or more branch offices, or that reside remotely in the public cloud where they are reachable via a WAN like the internet.

The location based storage layer is implemented by a metadata lookup map 104, a transaction log 103 and an SCO generator 105. They are jointly called the storage accelerator since the location-based storage layer virtually accelerates storage in any backend storage system. The storage accelerator brings storage closer to the hypervisor in a virtual machine centric way, making use of an intelligent 2-tier caching algorithm. "Virtual machine centric" in this context means that it enables to do all storage related activities like snapshotting, cloning or replication at the virtual machine level, enabling for instance administrators to easily select only the most important virtual machines for replication. The caching can be done inside the hypervisor by using a Virtual Storage Appliance or VSA to access local flash or SSD drives. The storage accelerator uses SSD or flash storage to serve as a read and write cache, virtually turning any backend storage capacity into high-speed storage.

The write caching works as a transaction log based cache on fast flash or SSD redundant storage. Data blocks of 4 kbyte are received by the block device 101 on IO path 108. The write cache is accomplished by filling up SCO's 151, 152 with each new 4*k* block that is written. As a result, any random write I/O behavior is turned into a sequential write operation. During each write, the address 141 of the 4 k block, and the location 142 comprising the SCO number 142A and the offset 142B within that SCO are stored as metadata in the metadata lookup map 104. The address 131 and location 132 are also logged by transaction log 103. The storage accelerator uses a distributed database to provide redundancy and immediate access to the metadata in case the volume is moved or failed-over to another cloud storage router. Only real data that is written to the cloud storage router will be stored as a result of which thin provisioning becomes possible. The transaction log 103 will immediately confirm the write to the hypervisor hence enabling fast response times while the SCO's 151, 152 can be pushed at a slower pace to the backend storage system(s).

In case of a read request, the storage accelerator will look-up the location in the metadata lookup map 104. If the requested data block exists in the cache, the storage accelerator will serve the read requests directly from the local SSD or flash storage, resulting in very fast read I/O operations.

The storage accelerator writes or reads the data using SCO's when it is communicating with the backend storage systems, not shown in FIG. 1. Because of the transaction log based approach in the storage accelerator, written data resides on redundant flash or SSD storage before it reaches the redundant backend storage. The storage accelerator drawn in FIG. 1 indeed enables a distributed transaction log 107. The distributed transaction log 107 will make sure that each 4 k block 171, 172 that is not yet part of an SCO that is stored in the backend storage system is synced to SSD or flash storage on another storage accelerator before it confirms the write to the guest. The size of the distributed transaction log 107 is very limited because there is only a need to protect data blocks 171, 172 that are not yet stored on the backend storage system. This is typically only a few outstanding SCO's per logical unit, which corresponds to Mbyte sizes rather than Gbyte sizes. However, the slower the backend storage or the higher the latency towards the backend storage, the larger the write cache that will be needed to cope with write bursts and the larger the distributed transaction log 107.

The cloud storage router illustrated by FIG. 1 implements a second, time-based storage layer. The SCO's 151, 152 and each set of transaction logs 131, 132, 133 that are created by the storage accelerator are therein treated as objects. For this reason, the containers that consists of a configurable maximum amount of 4 k blocks are called SCO's or Storage Container Objects. The benefit of this time-based storage layer is that it enables enterprise features like zero-copy snapshots and cloning.

The time-based storage also requires maintenance in order to compact and clean-up older SCO's and/or deleted snapshots. By having all transaction logs and SCO's stored on backend storage systems, these maintenance tasks can be offloaded from the storage accelerator. A scrubber, not drawn in FIG. 1, does the maintenance of the time-based storage. This scrubber works completely independent from the storage accelerator since it has access to all transaction logs and SCO's stored in the backend storage system. Once the scrubber has finished cleaning-up older SCO's and/or deleted snapshots, it will create an updated set of transaction logs that is being used by the storage accelerator to update the local metadata stored in the metadata lookup map 104. The obsolete SCO's on the backend storage system are deleted. Each scrubber is configurable to work on one or more namespace. Because of the caching in the storage accelerator, the maintenance work does not impact performance. As already mentioned here above, most read and write I/O requests will be served from the SCO cache. In the event of a disaster where the complete storage accelerator is lost, all the logical units can be rebuilt from the backend storage system.

In order to store the objects in a distributed and redundant way in the backend storage system, the storage accelerator has a storage distributor 106 in addition to the storage accelerator components 103, 104, 105. On the other hand, a third party cloud storage backend can be easily added by using the cloud storage initiator. Since the cloud storage initiator only stores, retrieves and changes SCO's, it makes it easy to add new cloud storage backend systems. Thus, the storage accelerator can basically use the storage distributor 106 or any cloud storage as a backend storage system to store the SCO's.

The storage distributor 106 will distribute written transaction logs 131, 132 coming from the storage accelerator towards the available resources on the distributed backend storage system. In addition, the storage distributor 106 divides each SCO in mega-blocks of typically 1 Mbyte. Erasure coding is then applied to each set of X mega-blocks in order to generate a set of Y mega-blocks containing redundant data since Y>X. Erasure coding is used to equally spread storage of the Y mega-blocks over the attached distributed backend storage system. Erasure coding is an algorithm that allows to create a configurable amount of redundant data such that a configurable amount of disks in the backend storage system can get lost, without data loss. The redundancy is created by pure processing power that doesn't require any read access on the storage capacity blocks to calculate parity, resulting in less disk spindles, less power consumption, better performance and the ability to distribute the data over the backend storage system. Furthermore, rebuilding redundancy for erasure encoded mega-blocks has no performance impact compared to for instance RAID technology. RAID has been designed for smaller disks. Nowadays, disks are reaching 3 to 4 Tbyte in capacity as a result of which RAID rebuild times after a lost disk are in the order of days and/or weeks rather than hours, resulting in a much higher chance of losing data and suffering serious performance issues during rebuilds.

Erasure coding allows to change the number of blocks to be stored any time. When new storage capacity is added or old storage capacity is removed, whether it is a single disk, a logical unit or a share, the storage distributor 106 will start spreading the data using all the new available blocks. This enables to grow or shrink data capacity and change redundancy on demand, independent of any storage technology or hardware that is used in the backend storage system(s).

If SCO's need to be stored in the cloud or on big data object infrastructure, the storage accelerator can be configured to use a cloud storage initiator, not drawn in FIG. 1, instead of the storage distributor 106. Due to the caching layer, i.e. SCO cache 105, the backend storage system can even be remote in the public cloud, accessible through a WAN with high latency like the Internet, while still experiencing local SSD/flash storage performance. When a slower backend storage system is used, it is recommended to use more flash or SSD storage capacity in the caching layer. By adding a larger SCO cache 105 the cloud storage router can deal with bigger bursts of written data without performance impact for the end user. Keeping more SCO's in cache storage helps to offset some of the penalties that are associated with accessing a slow backend storage system, mainly due to latency.

Each created logical unit will be stored in a different namespace or bucket in the case of an Amazon S3 or Openstack Swift backend storage system implementation. Because storage maintenance tasks can be done completely independent by the backend storage system, all SCO's stored in a public cloud system can be accessed from within that same public cloud system without the need of going over a slow internet link. In case of an Amazon S3 backend storage system for instance, the scrubbers can be spun up on EC2, using the local Amazon bandwidth to do the storage maintenance and shut downed once the work is done, resulting in less bandwidth consumption and lower Amazon costs. The storage accelerator will receive the changes on the SCO's by retrieving the scrubber transaction log via an object request to update his local metadata and will send the delete requests for the obsolete SCO's to the Amazon S3 backend. Furthermore, the whole logical unit can be rebuilt if necessary by accessing the namespace/bucket from a different location in case the cloud storage router on the initial location is lost.

Figure 2:
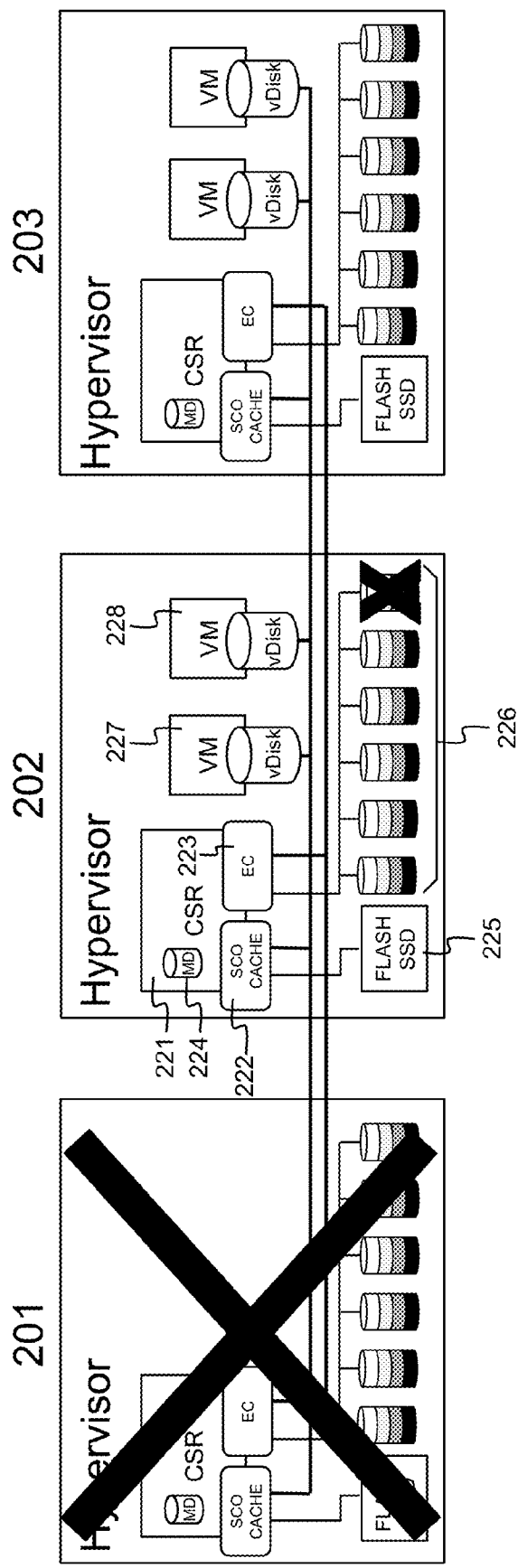
FIG. 2 illustrates a first use case of the method according to the present invention, i.e. protection against disk failures.

FIG. 2 illustrates a first use case of cloud storage router software program of FIG. 1, i.e. protection against disk failures. In FIG. 2, the hypervisors running on three standard x86 servers 201, 202 and 203 are drawn. Each of these servers, like for instance server 202, contains a flash drive 225 and six large SATA drives 226. By spreading the data across the different servers 201, 202, 203 using erasure coding with a disk safety policy of 18/7 meaning that 7 disks out of 18 can get lost, a full physical server, e.g. server 201, can be lost and even another drive, e.g. one of the drives 226, can be lost without any data loss.

When the cloud storage router, CSR or 221, consists of the storage accelerator, i.e. the SCO caching layer 222 with metadata lookup map MD or 224, and the storage distributor 223 applying erasure coding, it can be installed as local Virtual Storage Appliance or VSA that will work like a converged infrastructure setup. This allows administrators to scale out hypervisor and storage capacity with standard x86-hardware. In a converged infrastructure setup, the cloud storage router 221 is installed as a VSA inside the hypervisor and uses local flash or SSD storage 225 for caching. Additionally, the SCO cache 222 uses local SAS or SATA drives 226 to store the data from virtual machines 227 and 228 containerized in SCO's which can further be configured for different redundancy levels by using the erasure coding or EC technology in the storage distributor 223. The converged infrastructure becomes scalable and redundant when multiple converged nodes are added to the network. When multiple converged nodes like 201, 202 and 203 are registered, the storage distributor 223 is able to spread each SCO by using erasure coding to all available SAS/SATA drives in all registered nodes 201, 202 and 203.

By implementing the desired disk safety policy in the storage distributor 223, customers can lose a full server 201 and even additional disks without losing data. In the example above, a disk safety policy of 18/7 is used, allowing 7 disks out of 18 available disks—6 SAS/SATA disks are available in each node—to fail. As a consequence, a full node 201 can fail and even an additional disk on another node 202 can fail while still serving the workloads. The volumes that were running on the failed converged node 201 can be restarted on the remaining nodes 202 and 203 thanks to the distributed redundancy introduced by the cloud storage router. It is further noticed that customers can start with a single node and can change the disk safety policy when new nodes are added, allowing to scale.

The read performance of each node 201, 202, 203 in a converged infrastructure like the one illustrated by FIG. 2, is close to the sum of all SSD's used for caching. This means that with only a single SSD, more than 50.000 IOPS can be achieved on random 4 k data block reads. The write performance is increased in a number of ways: by adding a larger SCO cache, adding SSD or flash storage disks, adding nodes, and sequencing random write I/O operations. In a standard multi-node converged setup the cloud storage router 221 is configured to only use a fraction of the SSD storage 225 to act as write cache or SCO cache because spinning disks perform well on sequential 4 k writes.

The cloud storage router 221 is also hypervisor agnostic, allowing for instance to use VMware on one site and Hyper-V on another site. Thanks to its virtual machine or VM-centric approach, the cloud storage router 221 can replicate or move workloads between converged nodes 201, 202 and 203 running a different hypervisor technology without conversion.

Using the cloud storage router 221 in a converged infrastructure setup like the one illustrated by FIG. 2, customers don't need to manage a separate SAN or NAS infrastructure. This reduces the infrastructure cost, but also the operational costs. It allows customers to better scale costs to their business needs, reduce storage management and significantly reduce the power consumption of the cloud Infrastructure by using a VSA and erasure encoding.

Figure 3:
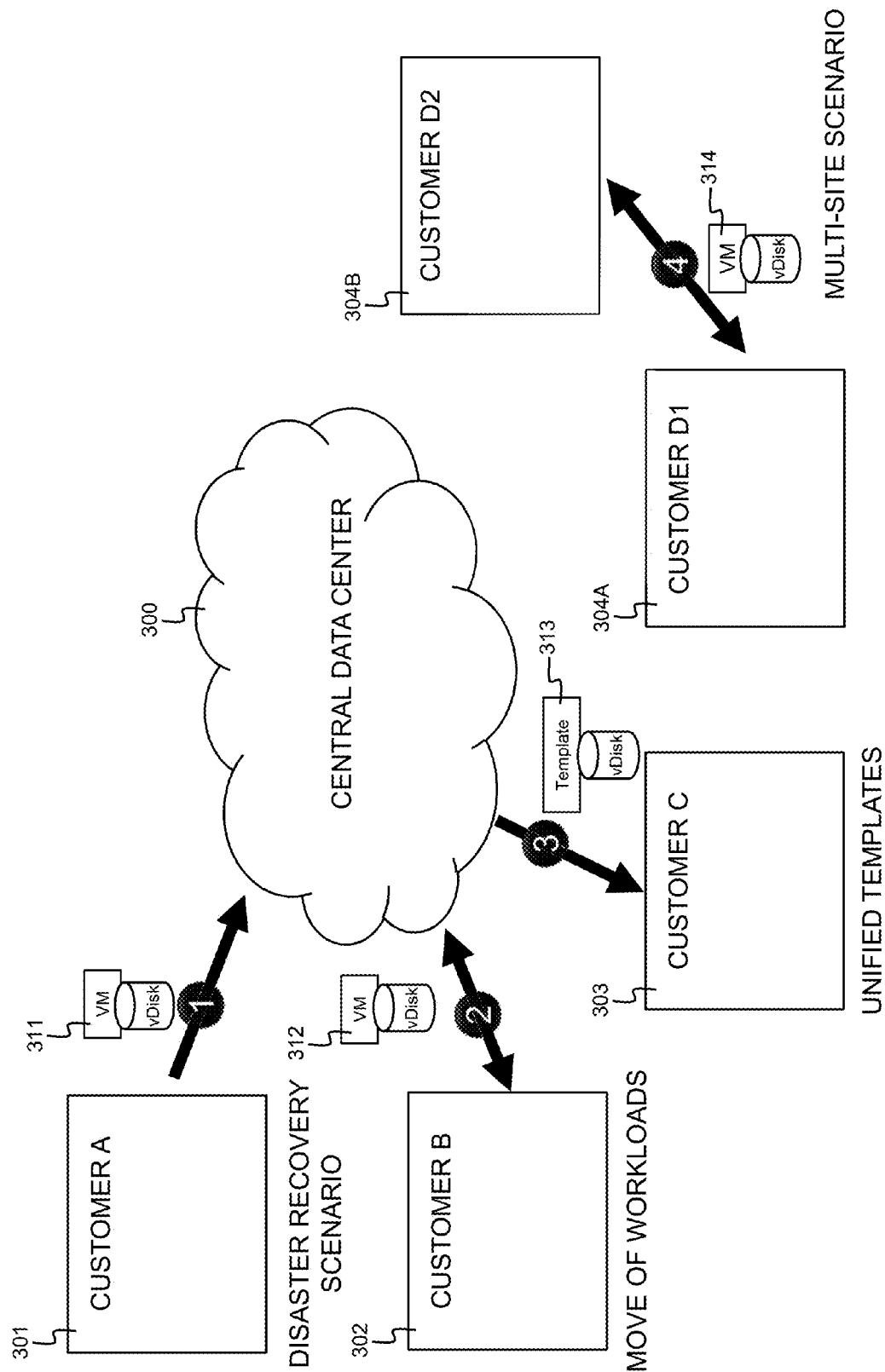
FIG. 3 illustrates a second use case of the method according to the present invention, i.e. a hybrid cloud storage implementation.

FIG. 3 illustrates a second use case of the cloud storage router computer program of FIG. 1, i.e. a hybrid cloud storage implementation.

The cloud storage router of FIG. 1 can be installed as a Virtual Storage Appliance or VSA on a running cloud infrastructure, making use of the existing backend storage infrastructure like SAN or NAS. The cloud storage router can leverage existing cloud infrastructures like for instance FlexPod or V-Block. By installing the cloud storage router on existing cloud infrastructure it can act as a replication target for a smaller converged infrastructure running in a branch office. By leveraging virtual machine centric storage workloads, customers can move between cloud infrastructures independent of the hypervisor or the storage technology that is being used. For example, a virtual machine running locally on a converged Hyper-V infrastructure can be moved to a public cloud running VMware on a FlexPod infrastructure. True data mobility is achieved because the cloud storage router is agnostic of the underlying hypervisor or storage backend system.

In FIG. 3, a few use cases are drawn that will drive the hybrid cloud model.

With customer A or 301, the disaster recovery scenario is illustrated. In this use case, a customer 301 can use the central data center 300 as a disaster recovery site, independent of the hypervisor or storage technology that is being used on both sides. The central data center 300 can be public cloud infrastructure or enterprise cloud infrastructure running the cloud storage router software program according to the present invention next to its current workloads. As a result of the virtual machine centric approach, only the differences between the selected virtual machines 311 are replicated to the central data center 300 using an intelligent replication algorithm to optimize the bandwidth usage. Thanks to the hypervisor agnostic approach, the local hypervisor can be different from the one in the data center 300. The cloud storage router also virtualizes the actual storage layer, making it possible to use Just a Bunch Of Disks or JBOD technology in one place and leveraging existing NAS/SAN storage in the data center 300.

With customer B or 302, the scenario of moving workloads is illustrated. By using the time based storage model to store the SCO's in backend storage systems, replication comes down to syncing the missing SCO's since the last common snapshots that exist at both locations. When the data are in sync, workloads can be moved from a remote site to the data center 300. Once the virtual machine 312 boots up in the data center 300, it will start creating its own changed SCO's from that common snapshot. Moving the workload back to its original location comes down to keeping track of these generated SCO's and syncing them back to the original location. Moving workloads can be done at the virtual machine level by syncing changes in both directions, independent from which hypervisor or storage hardware is being used at both locations. The cloud storage router software according to the present invention hence is an ideal technology to move workloads.

With customer C or 303, the use case of unified templates is illustrated. Indeed, unified templates 313 can be created and provisioned to run on different hypervisors, VMWare and Hyper-V for example, allowing administrators to easily push virtual appliances to their end users, independent of which hypervisor they are using.

With customer D1 or 304A and customer D2 or 304B, the multi-site scenario is illustrated. When running the cloud storage router software from FIG. 1 as converged infrastructure, the users 304A and 304B can replicate or move workloads like virtual machine 314 between different sites, independent of their running hypervisors.

Figure 4:
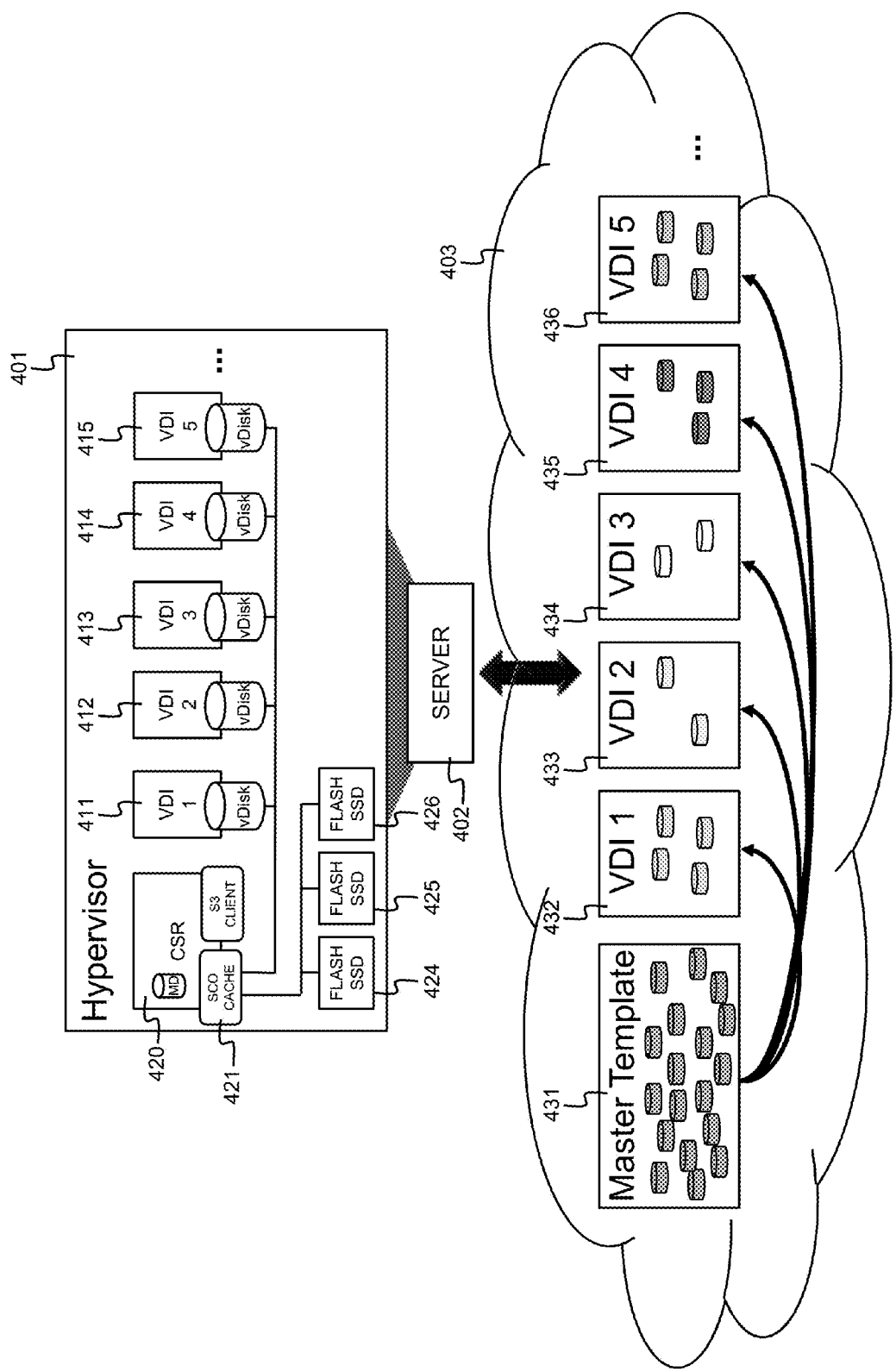
FIG. 4 illustrates a third use case of the method according to the present invention, i.e. a virtual desktop infrastructure implementation.

FIG. 4 illustrates a third use case of the cloud storage router software program of FIG. 1, i.e. a virtual desktop infrastructure implementation.

The cloud storage router CSR or 420 can spin up thin clones from a master template 431. CSR 420 thereto has an advanced REST API, allowing to spin up multiple virtual machines, 411, 412, 413, 414, 415, using only a few API calls. This makes CSR 420 ideal to integrate into a virtual desktop integration or VDI solution. Once the master template 431 is uploaded into CSR 420, each virtual desktop, VDI1, VDI2, VDI3, VDI4 and VDI5 will be a thin clone of the master template 431 on the backend. Only the individual changes of each virtual desktop will be tracked as SCO's in a different namespace, while the hypervisor 401 will see each thin cloned logical unit or vDisk as a full writeable volume. By making use of the cache 421, boot storms are avoided because each virtual machine will read the same data during boot and all these read requests will be served out of flash or SSD storage 424, 425, 426. By using thin cloning, customers can keep track of individual changes in each desktop and provide features like continuous data protection or replication. It is noticed that when CSR 420 would be run in a converged setup, one or more servers could be used to serve hundreds or more desktops. By adding more nodes, the storage and hypervisor capacity will scale out, resulting in extra virtual desktop capacity. Because these desktops can run on standard hardware, without the need of an external storage array, a VDI solution already becomes advantageous when only a few desktops are needed. A standard server can easily handle hundred virtual desktops without the need of a small SAN or NAS that typically costs a fourfold of the server to run a similar amount of virtual desktops.

The VDI solution could be running on standard x86 hardware 402, containing for instance SSD storage and SAS/SATA drives, not drawn in FIG. 4. The master template would be preloaded in the system, while for each virtual desktop VDI1 . . . VDI5 only the changes would be tracked. The same features that apply to the converged infrastructure use case would also apply to this VDI setup. This would enable customers to scale gradually by adding additional nodes and would allow to use virtual machine centric enterprise storage features like unlimited snapshotting or replication of individual virtual desktops.

As is illustrated by FIG. 4, by using the cloud storage initiator instead of the local erasure coding client and by making use of a larger read/write cache, customers can take advantage of running their virtual desktops 432, 433, 434, 435, 436 on public cloud storage 403. The cloud storage initiator will store the SCO's as objects in the cloud storage system 403, for example Amazon S3 or Swift Openstack implementations or a remote data center. Also, due to the use of thin cloning and thin provisioning, a master bucket/namespace can be used to store the VDI templates. Additionally, thin cloning can be used to store individual changes on each virtual desktop into a different bucket/namespace to keep track of the individual changes and snapshots.

Figure 5:
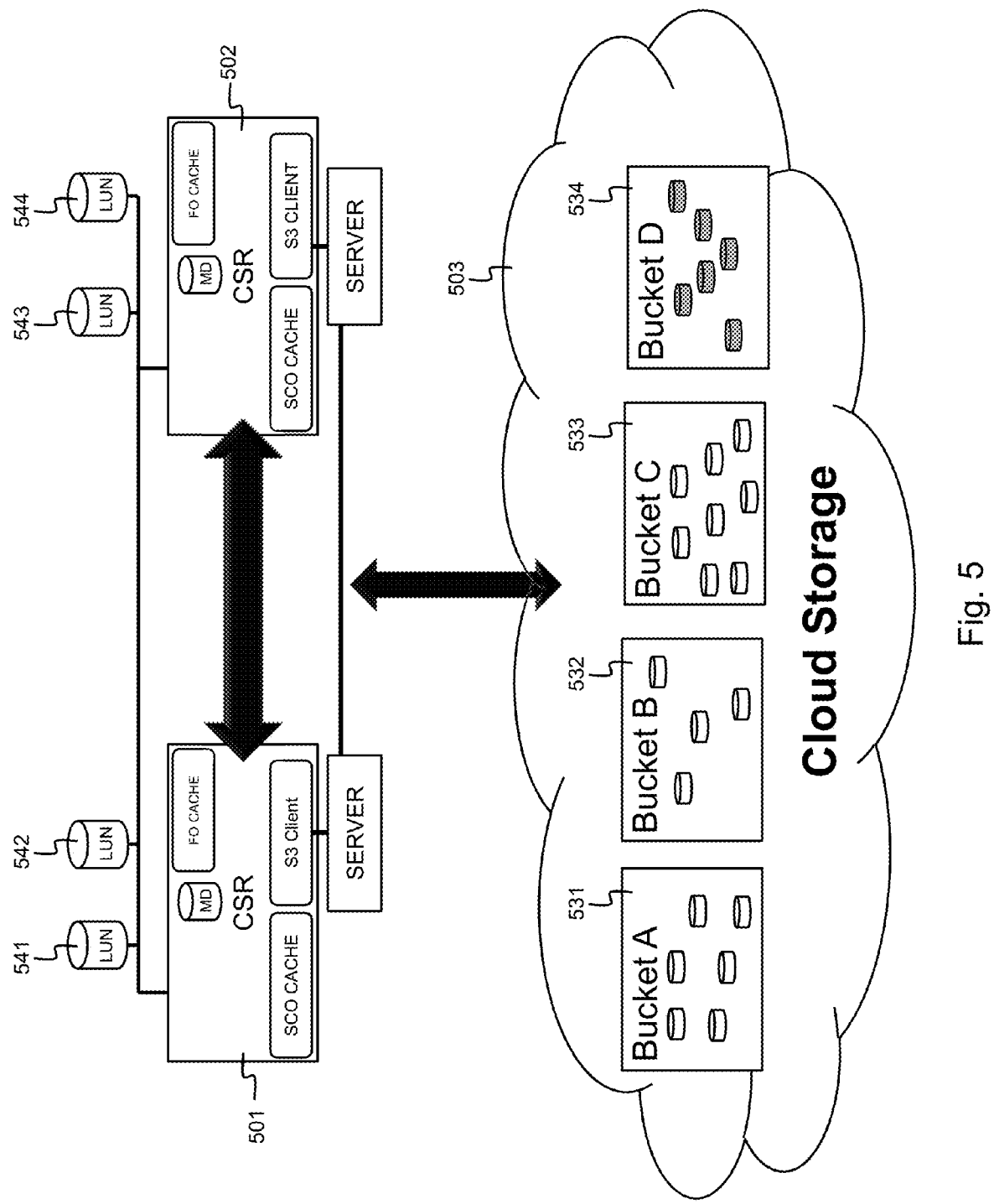
FIG. 5 illustrates a fourth use case of the method according to the present invention, i.e. a cloud storage gateway implementation.

FIG. 5 illustrates a fourth use case of the cloud storage router computer program of FIG. 1, i.e. a cloud storage gateway implementation.

The cloud storage router 501, 502 can be set up as a single or redundant cloud storage gateway by making use of a redundant storage accelerator implementation that is using the Fail-Over cache mechanism FO CACHE in the cloud storage router 501, 502. The cloud storage gateway can act as an iSCSI storage or even as a NAS device that creates a new namespace or bucket, Bucket A or 531, Bucket B or 532, Bucket C or 533, Bucket D or 534, for each logical unit 541, 542, 543, 544, that is being created. A similar setup has been explained in the virtual desktop integration use case here above. It can run as a clustered virtual or physical appliance, allowing customers to store data into cloud storage 503. The cloud storage gateway will be able to leverage all the storage features from the cloud storage router and enable read/write caching from the storage accelerator. This will give customers an experience as if they had their storage on-premise. In addition, thin clones or unlimited snapshots can be created to allow administrators to quickly create new writeable copies of their data or quickly roll back to an older snapshot. In case of an entire CSR cluster failure due to a disaster on site, all the logical units from the backend storage system can be rebuilt.

The method according to the invention shall typically be computer-implemented on a data processing system or computing device. A data processing system or computing device that is operated according to the present invention can include a workstation, a server, a laptop, a desktop, a hand-held device, a mobile device, a tablet computer, or other computing device, as would be understood by those of skill in the art.

The data processing system or computing device can include a bus or network for connectivity between several components, directly or indirectly, a memory or database, one or more processors, input/output ports, a power supply, etc. One of skill in the art will appreciate that the bus or network can include one or more busses, such as an address bus, a data bus, or any combination thereof, or can include one or more network links. One of skill in the art additionally will appreciate that, depending on the intended applications and uses of a particular embodiment, multiple of these components can be implemented by a single device. Similarly, in some instances, a single component can be implemented by multiple devices.

The data processing system or computing device can include or interact with a variety of computer-readable media. For example, computer-readable media can include Random Access Memory (RAM), Read Only Memory (ROM), Electronically Erasable Programmable Read Only Memory (EEPROM), flash storage or other storage technologies, CDROM, digital versatile disks (DVD) or other optical or holographic media, magnetic cassettes, magnetic tape, magnetic disk storage or other magnetic storage devices that can be used to encode information and can be accessed by the data processing system or computing device.

The memory can include computer-storage media in the form of volatile and/or nonvolatile memory. The memory may be removable, non-removable, or any combination thereof. Exemplary hardware devices are devices such as hard drives, solid-state memory, optical-disc drives, or the like. The data processing system or computing device can include one or more processors that read data from components such as the memory, the various I/O components, etc.

The I/O ports can allow the data processing system or computing device to be logically coupled to other devices, such as I/O components. Some of the I/O components can be built into the computing device. Examples of such I/O components include a microphone, joystick, recording device, game pad, satellite dish, scanner, printer, wireless device, networking device, or the like.

Although the present invention has been illustrated by reference to specific embodiments, it will be apparent to those skilled in the art that the invention is not limited to the details of the foregoing illustrative embodiments, and that the present invention may be embodied with various changes and modifications without departing from the scope thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. In other words, it is contemplated to cover any and all modifications, variations or equivalents that fall within the scope of the basic underlying principles and whose essential attributes are claimed in this patent application. It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfil the functions of several means recited in the claims. Any reference signs in the claims shall not be construed as limiting the respective claims concerned. The terms "first", "second", third", "a", "b", "c", and the like, when used in the description or in the claims are introduced to distinguish between similar elements or steps and are not necessarily describing a sequential or chronological order. Similarly, the terms "top", "bottom", "over", "under", and the like are introduced for descriptive purposes and not necessarily to denote relative positions. It is to be understood that the terms so used are interchangeable under appropriate circumstances and embodiments of the invention are capable of operating according to the present invention in other sequences, or in orientations different from the one(s) described or illustrated above.

The invention claimed is:

1. A computer-implemented method with layered storage of enterprise data, said method comprising:
   receiving from one or more virtual machines data blocks having a fixed length block size in the range from 4 kilobyte to 64 kilobyte;
   storing said data blocks in a local memory of a storage accelerator that constitutes a first tier storage layer;
   time-sequentially grouping said data blocks into data containers having a configurable maximum container size in the range from 1 megabyte to 256 megabyte;
   dividing each data container in X fixed length mega-blocks, X being a first integer number;
   for each data container applying erasure encoding to said X fixed length mega-blocks to thereby generate Y fixed length mega-blocks with redundant data, Y being a second integer number larger than X; and
   distributed storing said Y fixed length mega-blocks over one or multiple backend storage systems that constitute a second tier storage layer.

2. A computer-implemented method for layered storage of enterprise data according to claim 1, wherein said one or multiple backend storage systems are local and/or remote cloud storage systems operated by different cloud storage operators.

3. A computer-implemented method for layered storage of enterprise data according to claim 1, further comprising:
   storing for each data block its address, a container number and an offset number as metadata.

4. A computer-implemented method for layered storage of enterprise data according to claim 1, further comprising:
   storing each data block that is not yet part of a data container that is remotely stored, in a distributed transaction log of another storage accelerator.

5. A computer-implemented method for layered storage of enterprise data according to claim 1, wherein said one or multiple backend storage systems comprise various types of backend storage systems.

6. A computer-implemented method for layered storage of enterprise data according to claim 1, further comprising:
   scrubbing said mega-blocks distributed over multiple backend storage systems.

7. A data processing system comprising:
   one or more processing units; and
   one or more computer-readable mediums having stored thereon executable instructions, which, when executed by the one or more processing units, cause the system to perform at least the following layered storage of enterprise data:
   receive from one or more virtual machines data blocks having a fixed length block size in the range from 4 kilobyte to 64 kilobyte;
   store said data blocks in a local memory of a storage accelerator that constitutes a first tier storage layer;
   time-sequentially group said data blocks into data containers having a configurable maximum container size in the range from 1 megabyte to 256 megabyte;
   divide each data container in X fixed length mega-blocks, X being a first integer number;
   for each data container applying erasure encoding to said X fixed length mega-blocks to thereby generate Y fixed length mega-blocks with redundant data, Y being a second integer number larger than X; and
   distributed store said Y fixed length mega-blocks over one or multiple backend storage systems that constitute a second tier storage layer.

8. One or more non-transitory computer readable storage mediums having instructions stored thereon, which, when executed on a computer comprising one or more processing units, cause the one or more processing units to perform a method with layered storage of enterprise data, the method comprising:
   receiving from one or more virtual machines data blocks having a fixed length block size in the range from 4 kilobyte to 64 kilobyte;
   storing said data blocks in a local memory of a storage accelerator that constitutes a first tier storage layer;
   time-sequentially grouping said data blocks into data containers having a configurable maximum container size in the range from 1 megabyte to 256 megabyte;
   dividing each data container in X fixed length mega-blocks, X being a first integer number;
   for each data container applying erasure encoding to said X fixed length mega-blocks to thereby generate Y fixed length mega-blocks with redundant data, Y being a second integer number larger than X; and distributed storing said Y fixed length mega-blocks over one or multiple backend storage systems that constitute a second tier storage layer.

\* \* \* \* \*